United States Patent
Stribley et al.

(10) Patent No.: US 8,729,666 B2
(45) Date of Patent: May 20, 2014

(54) ULTRA-LOW VOLTAGE COEFFICIENT CAPACITORS

(75) Inventors: Paul Ronald Stribley, Plymouth (GB); Soon Tat Kong, Sibu Sarawak (MY); David John Verity, Plymouth (GB)

(73) Assignee: X-Fab Semiconductor Foundries AG (DE)

( * ) Notice: Subject to any disclaimer, the term of this patent is extended or adjusted under 35 U.S.C. 154(b) by 81 days.

(21) Appl. No.: 13/497,078

(22) PCT Filed: Sep. 23, 2009

(86) PCT No.: PCT/GB2009/051244
§ 371 (c)(1),
(2), (4) Date: May 10, 2012

(87) PCT Pub. No.: WO2011/036428
PCT Pub. Date: Mar. 31, 2011

(65) Prior Publication Data
US 2012/0211868 A1    Aug. 23, 2012

(51) Int. Cl.
*H01G 4/08* (2006.01)
*H01G 4/20* (2006.01)
*H01L 27/01* (2006.01)
*H01L 27/02* (2006.01)

(52) U.S. Cl.
USPC ............................... 257/532; 438/396

(58) Field of Classification Search
USPC .................. 257/532; 438/386, 396
See application file for complete search history.

(56) References Cited

U.S. PATENT DOCUMENTS

| 4,878,151 A | 10/1989 | Gallichio |
| 4,918,454 A | 4/1990 | Early et al. |
| 6,404,376 B1 | 6/2002 | Kalthoff et al. |
| 2002/0182794 A1* | 12/2002 | Ning et al. ................. 438/200 |
| 2003/0036228 A1* | 2/2003 | Jao ............................ 438/200 |
| 2004/0012911 A1* | 1/2004 | Lee et al. ................. 361/306.1 |
| 2004/0209423 A1 | 10/2004 | Tian et al. |
| 2007/0152295 A1* | 7/2007 | Yeh et al. ................. 257/516 |
| 2007/0200162 A1 | 8/2007 | Tu et al. |

FOREIGN PATENT DOCUMENTS

WO    2009/013533    1/2009

OTHER PUBLICATIONS

PCT, International Search Report, International Application No. PCT/GB2009/051244 (mailed Aug. 4, 2010, published Mar. 31, 2011).

* cited by examiner

*Primary Examiner* — Olik Chaudhuri
*Assistant Examiner* — Nicholas Tobergte
(74) *Attorney, Agent, or Firm* — Thompson Hine L.L.P.

(57) ABSTRACT

A capacitor has first and second conducting plates and a dielectric region between the plates, wherein the dielectric region comprises two dielectric materials for each of which the variation of capacitance with voltage can be approximated by a polynomial having a linear coefficient and a quadratic coefficient, and wherein the quadratic coefficients of the two dielectric materials are of opposite sign. The capacitor comprises for example a first capacitor (42) and a second capacitor (44) that one connected in an anti-parallel manner. The insulating layer (18) of the first capacitor comprises silicon nitride and the insulating layer (16) of the second capacitor comprises silicon dioxide.

13 Claims, 8 Drawing Sheets

Capacitor stack (PIP 44 and MIM 42) [110]

"Anti-parallel" capacitor stack

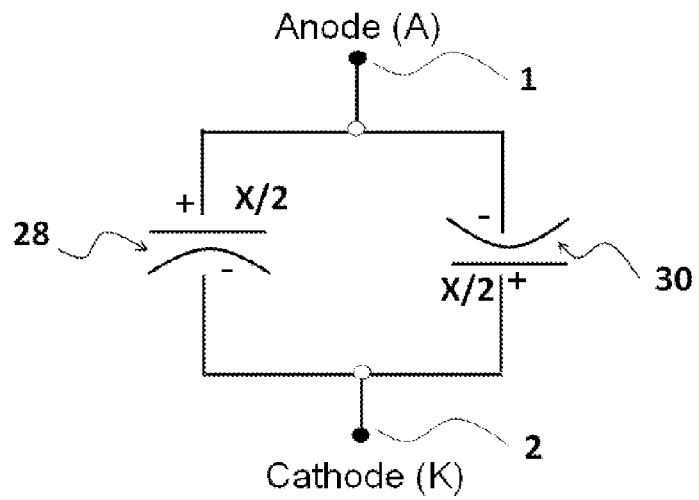
Prior Art
Fig. 1: Prior Art
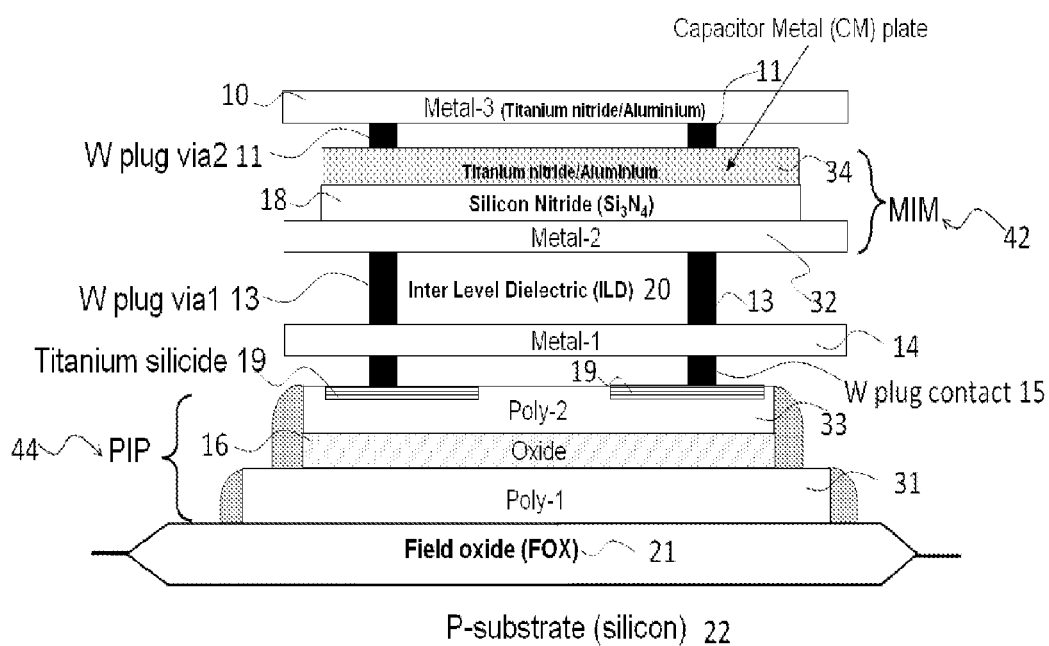
Capacitor stack (PIP 44 and MIM 42) [110]
Fig. 2

"Anti-parallel" capacitor stack

Common centroid pairs of "anti-parallel" capacitor stack (Unit cell)

"A" capacitor stack (PIP/MIM) mask layout (top view)

"B" capacitor stack (PIP/MIM) mask layout (top view)

ULTRA-LOW VOLTAGE COEFFICIENT CAPACITORS

This application is a national stage filing of PCT International Application No. PCT/GB2009/051244, the entire contents of which are incorporated by reference herein.

TECHNICAL FIELD

The invention relates to capacitors having improved voltage coefficients, and particularly, although not exclusively, to integrated circuit dielectric capacitors used within mixed signal application circuits such as a Polysilicon-Insulator-Polysilicon (PIP) capacitor, a Metal-Insulator-Metal (MIM) capacitor etc.

BACKGROUND

The following prior art documents relate to the background to this invention:
1. Patent WO2009013533: MIM capacitor structure and methods of manufacturing the same.
2. U.S. Pat. No. 4,878,151: Anti-parallel capacitor.
3. U.S. Pat. No. 4,918,454: Compensated capacitors for switched capacitor input of an analog-to-digital converter.
4. U.S. Pat. No. 6,404,376: Capacitor array having reduced voltage coefficient induced non-linearities.
5. US Patent No. 2007200162: Reducing dielectric constant for MIM capacitor
6. US Patent No. 2004209423: Methods for reducing capacitor dielectric absorption and voltage coefficient.

Various capacitors have been used in the fabrication of mixed analog and digital circuits. However, prior art integrated circuit capacitors have not been satisfactory in terms of VCC and the precision of capacitive charge distribution in a circuit.

In the past, there are several methods to reduce and/or eliminate the non-linearity of the voltage coefficient for a capacitor. In U.S. Pat. No. 4,878,151, issued on 31 Oct. 1989, an "anti-parallel" capacitor 100 has two capacitors connected which may achieve a constant voltage coefficient, if the polarity of one capacitor is connected to the reverse polarity of the other capacitor. Micheal J. Gallichio et al. states that the "anti-parallel" capacitor 100 is configured to cancel out the linear variation in the capacitance of each capacitor due to the reverse polarity of the two capacitors. The attached FIG. 1 shows a schematic diagram of the "anti-parallel" capacitor 100 of U.S. Pat. No. 4,878,151. Both capacitors 28 and 30 have a value of, say, X/2 and result in a total capacitance value of X.

Furthermore, U.S. Pat. No. 4,918,454, issued on 17 Apr. 1990, reveals that two capacitors 28 and 30, can be connected in parallel to form a capacitor array which has a lower voltage coefficient of capacitance.

However, the capacitance variation for real components is not only a linear voltage dependence. A cross-coupled parallel capacitor pair will eliminate a linear variation but will do nothing to diminish a non-linear change. These non-linear variations (eg curvature) in the capacitance versus voltage will not be removed by simply using an anti-parallel connection.

SUMMARY

The invention provides a capacitor, and capacitor arrangements, as set out in the accompanying claims.

BRIEF DESCRIPTION OF DRAWINGS

Embodiments of the invention will now be described, by way of example only, with reference to the accompanying drawings, in which:

FIG. 1 shows a schematic representation of an example "anti-parallel" capacitor configuration of the prior art;

FIG. 2 shows a simplified cross-section view of the PIP 44 and MIM 42 capacitors on a semiconductor wafer which is related to embodiments of the present invention. Note that the bottom PiP capacitor plate (31) is electrically connected to the metal 3 MiM plate (10), but this is not shown explicitly in the diagram;

FIG. 5 (b) is a plot illustrating the capacitance variation for "anti-parallel" PIP capacitors only FIG. 5 (c) is a plot illustrating the capacitance variation for a PIP and MIM common centroid pair of "anti-parallel" capacitor stacks, such as shown in FIG. 3;

FIG. 6 (b) shows an integrated MIM capacitor which is formed from metal layers, silicon nitride and oxide (eg silicon dioxide);

FIG. 7 (b) shows a mask layout (top view) of a capacitor stack "B", adjacent to "A", in accordance with an embodiment of the present invention;

DETAILED DESCRIPTION

Figure 3:
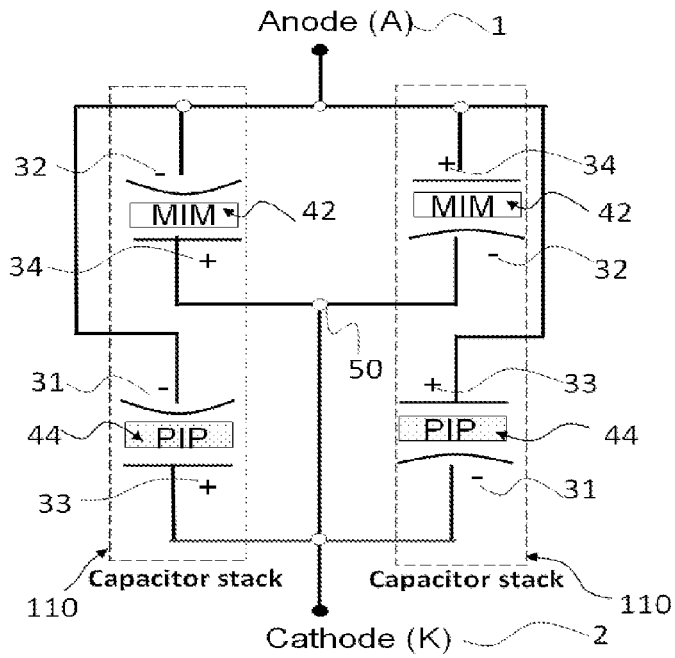
FIG. 3 shows a schematic diagram for "anti-parallel" MIM and PIP capacitors relating to one embodiment of the present invention.

Embodiments may use a combination of capacitor types to form a composite capacitor array which demonstrates a minimal capacitance change with applied voltage. The voltage dependent behaviour is numerically described by Voltage Coefficient of Capacitance (VCC) values. The present invention relates to a novel technique which allows these special low voltage coefficient devices to be created by using a common centroid pair of "anti-parallel 60 and 70" capacitors configured in a tessellated pattern. Arranging the capacitors about a "centroid" point reduces the effect of variations in properties across the wafer. Any variations tend to be cancelled out as a result of the common centroid arrangement of the components. Through a combination of capacitor types and layout style it is possible to engineer a cost-effective, ultra-low voltage coefficient solution on mainstream CMOS processes technologies. The same techniques could be employed on other process technologies: eg. bipolar, BiCMOS, SOI etc. In addition, this technique can be applied on various alternative capacitor structures which have been used in analog CMOS technology such as polysilicon-to-silicon capacitors, metal-to-silicon capacitors, metal-to-polysilicon capacitors etc.

Analog and mixed-signal circuit designers are continually looking for the best possible component behaviour to meet the needs of ever more challenging design specifications. Capacitors which have very low, or near-zero voltage coefficients are desired for some products such as Analog to Digital Converters (ADCs) to improve the accuracy of the circuits. However, the fabrication of various capacitor values may change the non-linear voltage coefficient with applied voltage due to a variety of physical properties, chemical properties, methods of fabrication and parasitic effects of an integrated circuit. Variation in the capacitance values in analog and mixed-signal circuitry may result in undesirable outputs and uncontrolled variations of a circuit.

Embodiments of the present invention will be described with reference to the attached drawings.

Embodiments are described in relation to a composite capacitor consisting of PIP 44 and MIM 42 capacitors as shown in FIG. 2. PiP and MiM capacitors are widely used for mixed signal circuitry because they are relatively straightforward to fabricate and integrate in modern semiconductor technologies such as CMOS. They also provide relatively good performance in terms of the voltage coefficient of capacitance, VCC, when compared to alternative devices, eg MOS capacitors. These capacitors can also readily be fabricated in a stacked manner (ie one on top of the other) to effectively double the total capacitance per unit area because the plates and dielectrics are independently constructed from different materials and at different processing stages.

The method for fabrication of the stacked MIM on PIP capacitor will be briefly described as follows.

The PIP capacitor 44 comprises a first Polysilicon-1 layer 31 which is deposited by chemical vapour deposition, CVD, or otherwise on a surface of field dielectric (silicon dioxide, FOX) 21 which is fabricated on a semiconductor wafer substrate 22. It is usually deposited simultaneously with the transistor polysilicon gates. (We note here that the suffix "-1", and the suffixes "-2" and "-3" used subsequently, in relation to the polysilicon and metal layers, indicate the order in which these layers are formed.) Next, a silicon dioxide dielectric 16 is then either grown thermally or deposited (or both), and a second layer of polysilicon, Polysilicon-2 33, is deposited on top and patterned to complete the single PIP capacitor 44.

The method for fabrication of the single MIM capacitor 42 is similar to the PIP capacitor 44 configuration. The capacitor is fabricated with Metal-2 32 and Metal-3 10 plates. The silicon nitride 18 capacitor dielectric (or some other dielectric material, eg silicon dioxide) is deposited by a Chemical Vapour Deposition (CVD) reaction on the top of Metal-2 32. After the formation of the capacitor dielectric, the top plate of the metal capacitor 34 is formed.

We comment here briefly on some further details of the layers of the MIM capacitor 42. The Metal-3 layer is formed from a layer of aluminium sandwiched between two thin layers of titanium nitride. Metal-3 layer is mainly aluminium. Layer 34 is mainly titanium nitride, and may also have a thin aluminium layer. The metal-1 and metal-2 layers are similar to the metal-3 layer.

FIG. 3 shows a schematic diagram of the "anti-parallel" capacitor stack (PIP/MIM). For simplicity, the two PIP capacitors 44 are labelled with a connection "polarity" which means they have positive (+) 33 and negative (−) 31 terminals. The positive (+) signs 33 correspond with the top Polysilicon-2 layer 33 of each PIP capacitor (as shown in FIG. 2), and the negative signs 31 correspond with the bottom Polysilicon-1 layer 31 of each PIP capacitor (as shown in FIG. 2). Also, the MIM capacitor 42 has implicit polarity which can be inserted into a circuit. The positive (+) signs 34 next to the two MIM capacitors in FIG. 3 represent the metal layer 34 of the MIM capacitor (as shown in FIG. 2). The negative (−) symbols marked on the two MIM capacitors in FIG. 3 indicate the bottom Metal-2 layer 32. The cross-wiring 50 (see FIG. 3) of the "anti-parallel" capacitor stack is connected to interconnect metal layers such as Metal-1 14, Metal-2 32 and Metal-3 10.

The integrated capacitor array of FIG. 3 provides a better solution compared to the prior art. The combination of the PIP 44 and MIM 42 capacitor types with a common centroid pair of "anti-parallel" capacitor layout minimises or cancels the non-linear voltage coefficient, as well as cancelling the linear voltage coefficient.

Figure 4:
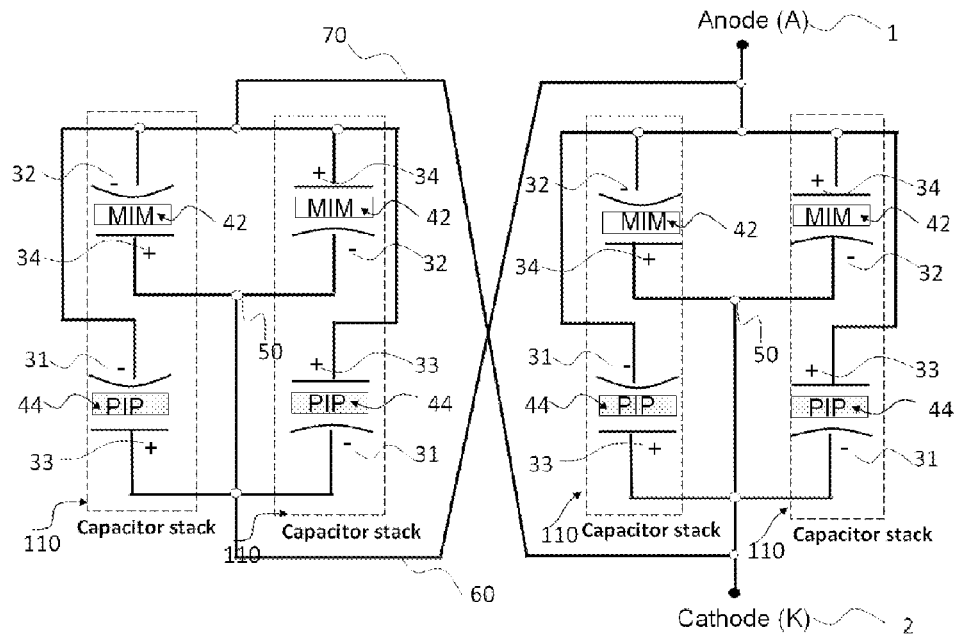
FIG. 4 shows a unit cell for a common centroid pair of "anti-parallel" capacitor stacks relating to one embodiment of the present invention.

In one embodiment, the common centroid pair of the "anti-parallel" capacitor stack is configured of four capacitor stacks as shown in FIG. 4. These four capacitor stacks form a unit cell in an array. The implementation of the integrated capacitor consists of an array comprising at least four capacitor stacks combined in an "anti-parallel" style.

In general, the voltage behaviour of capacitance can be described using a mathematical polynomial formula as follows:

$$C(V) = C_0(1 + \beta V + \alpha V^2)$$

Where $C_0$ is the capacitance at zero voltage and V is the voltage applied between the MIM or PIP electrodes. $\beta$ and $\alpha$ are the linear coefficient and quadratic coefficient of a capacitor. Normally, voltage coefficient of capacitance is measured in a few parts per million per volt (ppm/V) for a linear term ($\beta$) and in a few parts per million per volt$^2$ for a quadratic term ($\alpha$). For example, good VCC coefficients would be below about 30 ppM/V and below about 30 ppM/V$^2$ in magnitude. But much larger values can be seen in practice.

Ultra-low VCC values need to be about 10× better; less than 3 ppM/V and less than 3 ppM/V$^2$.

Other polynomial coefficients could be added for cubic and quartic terms (voltages expressed to the powers of three and four). These would allow ever greater precision for the modelled fit of the capacitance versus voltage relationship. But the capacitance variations seen in reality are more commonly modelled using just the two terms shown in the formula above, especially if the C(V) variations are relatively small percentages.

Several examples are hereinafter described to illustrate VCC improvements which can be achieved using the present invention.

Figure 5:
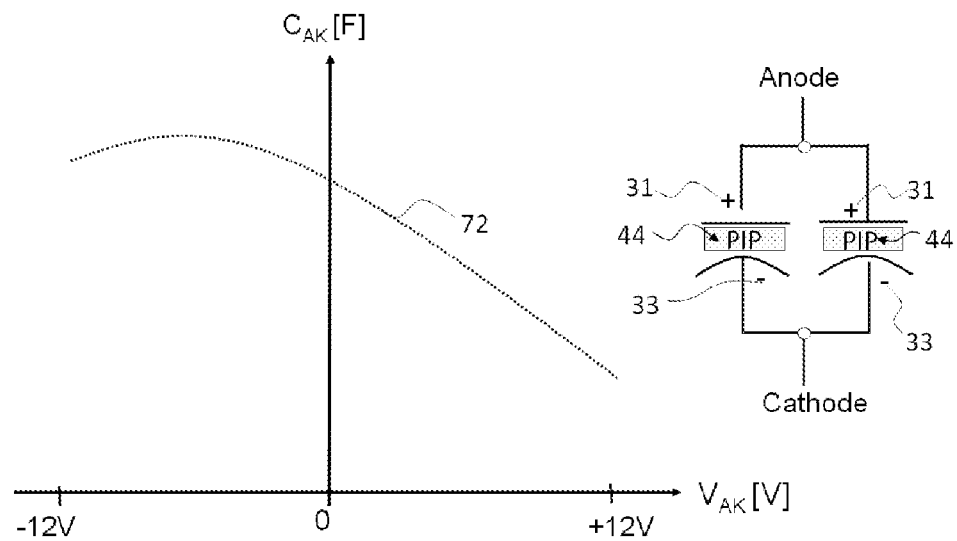
FIG. 5 (a) is a plot illustrating the capacitance variation for a PIP capacitor only.
Figure 5:
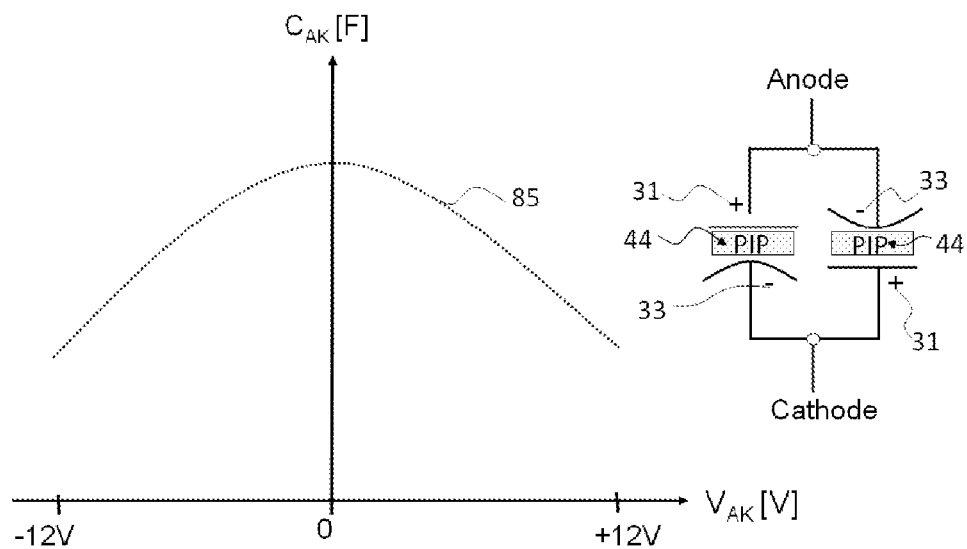
Figure 5:
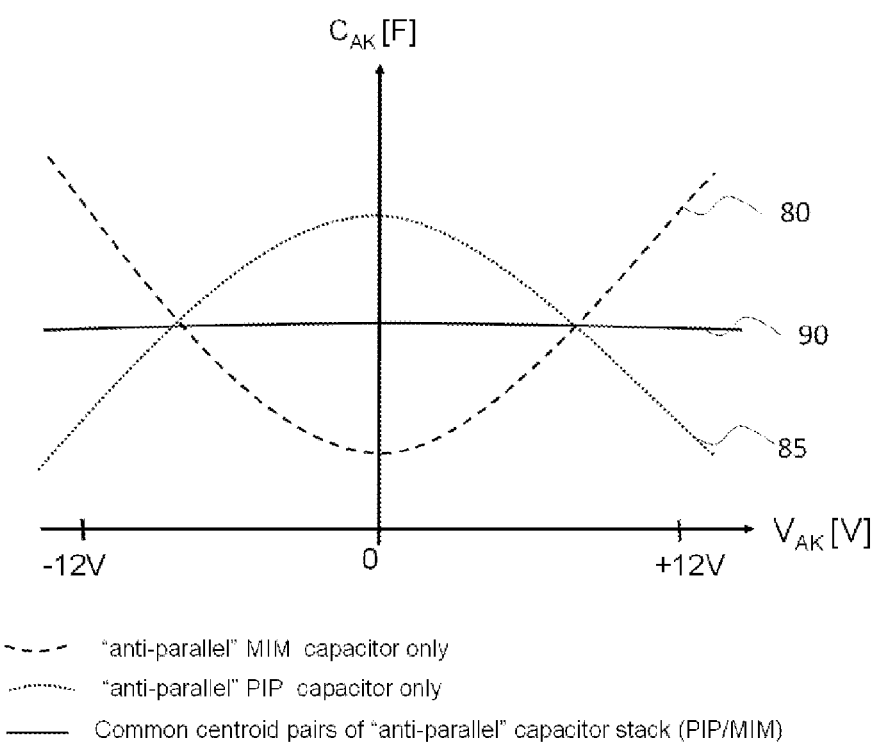

FIG. 5 (a) shows the example of the variation of capacitance for the PIP capacitor type. The fabricated PIP capacitor 44 suffers from the capacitance variation due to carrier depletion in the polysilicon—a doping concentration effect and also perturbations from silicon dioxide trapped charges and interfacial traps and charges. This leads to the fabricated PIP C(V) curve exhibiting an asymmetric concave "downwards" shape 72 in the capacitance as a function of applied voltage. As a result, the linear coefficient values of the capacitor become large when compared with quadratic coefficient values. There is a significant downwards slope with voltage—this slope indicates a significant linear coefficient term.

However, an "anti-parallel" PIP capacitor arrangement minimises the linear variation (linear coefficient) of the capacitance. This technique achieves a symmetric curve 85 of the capacitance by connecting PIP capacitors in an "anti-parallel" configuration as shown in FIG. 5 (b). But, the capacitance plot is still a convex "downwards" curve due to the quadratic coefficient values. The capacitance versus voltage, C(V) curve shape shown in FIG. 5c for a PIP has a negative quadratic coefficient. The magnitude of the coefficient describes the amount of the curvature. The polarity of the coefficient describes its curve direction (either curving up or down for positive or negative number respectively) with bias voltage applied.

Moreover, MIM capacitors 42 suffer from dielectric absorption and charge trapped in a silicon nitride 18 dielectric. The capacitance curve of "anti-parallel" MIM capacitors is convex "upward" 80 which is dependent on the fabrication process. An "anti-parallel" connection for a pair of MIM capacitors is used to eliminate any linear coefficient term. For the composite MIM capacitor the residual C-V curve shape, as shown in FIG. 5c, has a positive quadratic coefficient; capacitance increases slightly with bias voltage magnitude, either for positive or negative voltage values.

Embodiments may involve the combination of different capacitor types with different selective dielectric materials to form a capacitor array, in order to achieve an ultra-low VCC. The combination of PIP and MIM capacitors in an array can reduce and/or eliminate the VCC non-linearity, because the curvature of the capacitance versus voltage is opposite in nature. Combination of two symmetric devices (PIP and MIM capacitors) gives the flatter response 90 of the capacitance as shown in FIG. 5 (c). Opposite curvatures can be used to completely cancel out the quadratic coefficient value, if the capacitance variation is similar in magnitude for the MIM and the PIP components.

Therefore, improvement is achieved over the prior art due to the improved VCC especially the minimisation of the quadratic coefficient value (curvature) and elimination of the linear coefficient (slope). This allows the manufacture of real capacitors having low VCC values.

In order to achieve this result the two capacitor dielectric materials must have opposite curvatures of their C(V) responses. Silicon dioxide and silicon nitride make an excellent pair in this respect. However, other materials may be paired together in the same way. Alternatively the C(V) shape of a particular capacitor could be modified in some way, eg by implanting charge into the dielectric, or changing the doping of the adjacent semiconductor material so that it depletes more or less with applied voltage.

A MIM and and PIP combination is convenient for CMOS processes. Likewise a composite capacitor may be formed using a pair of MIMs which are made with two different dielectric materials, eg silicon dioxide for one MIM and silicon nitride dielectric for the other. The two MIMs can also be stacked together to reduce the physical area required on chip for a composite capacitor by increasing the total capacitance per unit area.

The invention could also be made with non-stacked capacitor components. However there would be an area penalty for such an arrangement. However a very low VCC capacitor would be possible, even if the capacitors were not stacked on top of each other. The vertical stacking of capacitors is not the reason the low VCC is achieved, but it does help to increase the total capacitance per unit area. This is often an important design feature for circuits which need a large number of capacitors since they can be made smaller, cheaper and more economically.

Figure 6A:
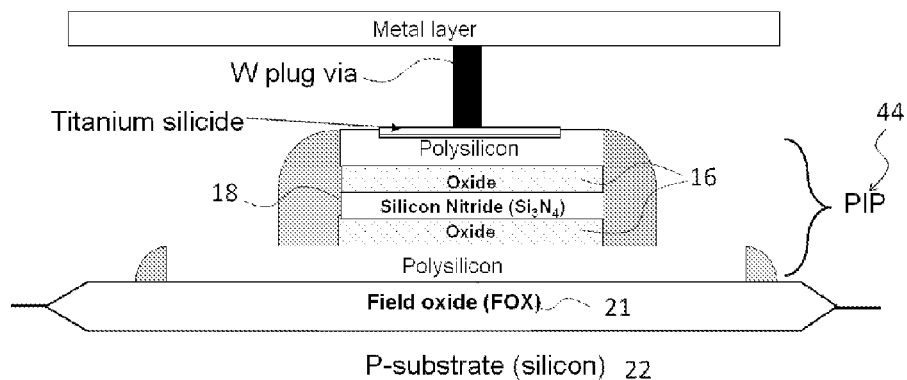
FIG. 6 (a) shows an integrated PIP capacitor which is formed from polysilicon, silicon nitride and oxide (eg silicon dioxide)
Figure 6B:
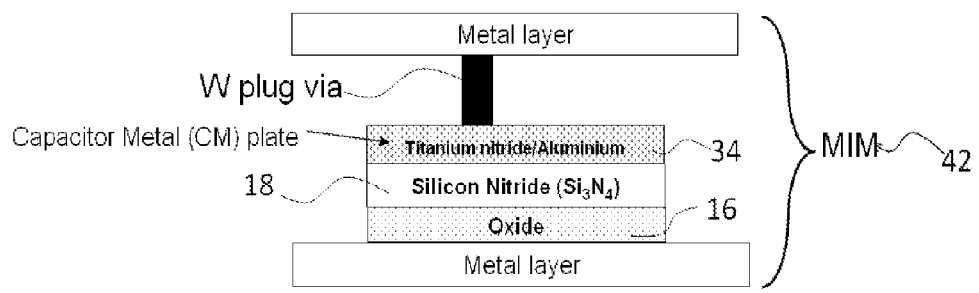

In addition to the above embodiments, single PIP (FIG. 6a) and single MIM (FIG. 6b) capacitors can be fabricated by putting both dielectric layers (silicon nitride 18 and silicon dioxide 16) which have the desired voltage behaviour in the same capacitor. Nevertheless, these methods are less likely to achieve an ultra-low VCC due to the generation of oxide-trapped charges and especially interface traps in layered silicon oxide/silicon nitride structures. An interface region is usually detrimental to a capacitor due to the extra charge trap sites that are introduced. This can lead to non-linear capacitance characteristics for these types of integrated capacitors. Charge trapping can also lead to CV hysteresis and memory effects in capacitors where charges become trapped and cause some electrical polarisation of the dielectric. However this alternative technique can be used to offer some benefits for VCC over the simplest capacitors which only use single layer dielectric materials.

Figure 7A:
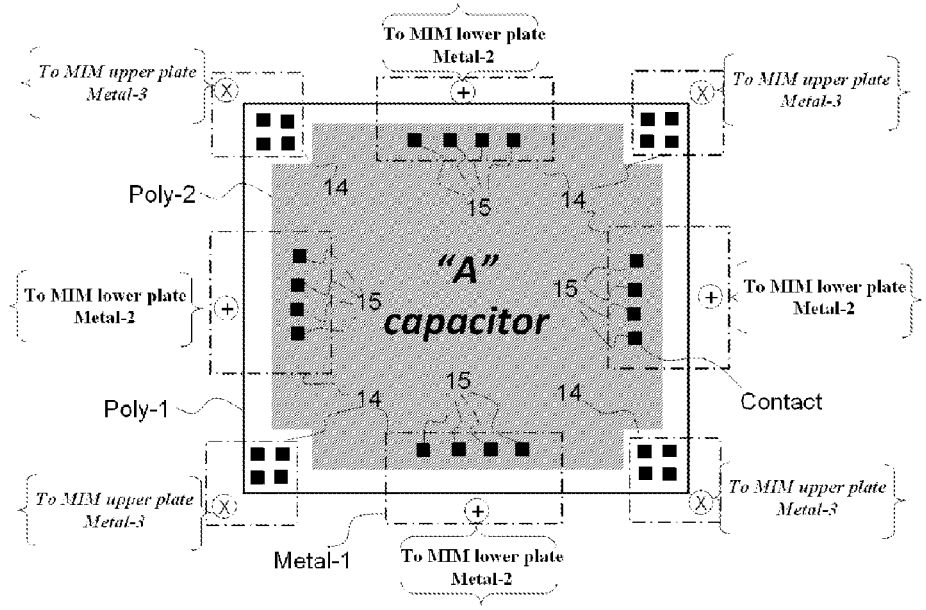
FIG. 7 (a) shows a mask layout (top view) of a capacitor stack "A" in accordance with an embodiment of the present invention.
Figure 7B:
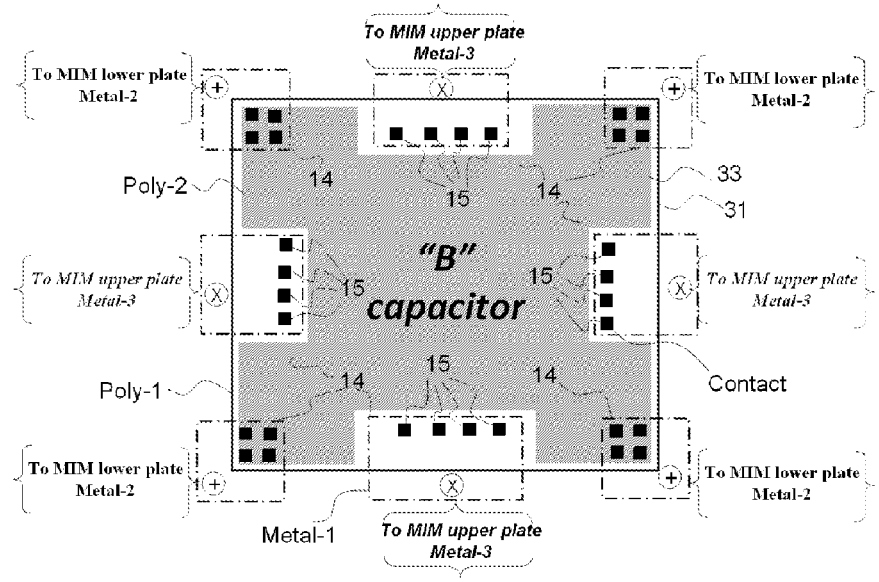

We also describe a layout design of the common centroid pair of "anti-parallel" capacitor stack. The method employed to connect together the capacitor components will now be described. FIG. 7 (a) and FIG. 7 (b) show the mask layouts of "A" and "B" style capacitor stacks. In order to understand the embodiment, some critical mask layers have been defined such as Polysilicon-1 31, Polysilicon-2 33, contacting holes 15, Metal-1 14. In FIG. 7(a) the polysilicon-2 layer is represented by a grey rectangle, and the polysilicon-1 layer is represented by a white rectangle beneath the polysilicon-2 layer. The difference between the capacitors "A" and "B" in an array are the layout patterns of Polysilicon-1 31 and Polysilicon-2 33 and their edge connections. Each capacitor layout consists of different orientations of edge connections. For instance, the symbol
⊕ in the layouts represents the wiring connections between the Metal-1 14 to MIM 42 lower plate Metal-2 32. In addition, the symbol ⊗ indicates the wiring connections between the Metal-1 14 to MIM 42 upper plate Metal-3 10.

The "A" and "B" capacitors of FIGS. 7(a) and (b) are positioned adjacent to each other, and are electrically connected along one of their sides so that + terminals are connected to x terminals. This achieves the connections shown in FIG. 3, in which the poly-1 and poly-2 layers of the two PIP capacitors are connected together.

Both "A" and "B" capacitors have the same area and perimeter. This ensures that they can be combined to give equal capacitances in the "anti-parallel" pairs. It is necessary to do this because the linear voltage coefficient should then be completely cancelled by the pair. The upper and lower plates are arranged to be connected in opposite polarities. One plate is connected at its four corners, and the other plate is connected at the centres of all its edges.

Figure 8:
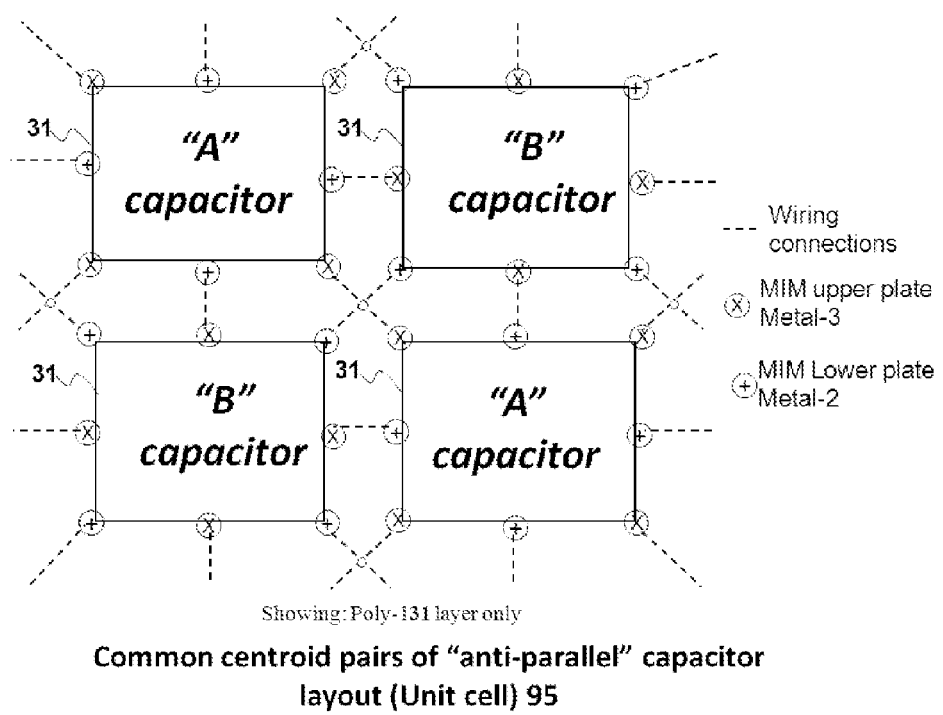
FIG. 8 shows a unit cell layout (top view) of common centroid pairs of "anti-parallel" capacitors in a tessellated pattern in accordance with an embodiment of the present invention.

FIG. 8 shows a unit cell layout of a common centroid pair of "anti-parallel" capacitor stack. A common centroid layout allows easy design of various capacitor values needed for circuit use. Also, the common centroid arrangement in capacitor layout is much better for matching capacitors if there is a small lateral variation in thickness of the dielectric films across the chip surface. If the dielectrics thickness vary then the amount of capacitance can be different and also the voltage coefficients. It is desired to cancel the voltage coefficients and so arranging an anti-parallel pair around a central point ensures that the thickness values for all capacitor stacks in the unit cell are referenced to the same physical position on the surface of the chip. For the unit cell, a "localised matching" is important to minimise VCC and also to minimise variation due to manufacture. i.e. tolerance to process variations. The unit cell comprises two units of capacitor "A" and "B" which are arranged around a common central point (the common centroid of the pattern).

A capacitor is made from either one unit cell or an array of many. In each unit cell the common centroid design style ensures that the local voltage coefficients are minimised. By adding unit cells together different capacitor values can be made on the same chip.

Other benefits of the unit cell break-up of the capacitor are as follows:

a) Ease of design process and optimisation. A unit cell is simply repeated in an array to allow capacitors with different capacitance to be made.

b) Unit cells, and the capacitors "A" and "B", break-up the capacitor to relieve any mechanical stress incorporated into the structure during manufacture. This is especially important for large capacitances.

c) The present invention provides a method to reduce the likelihood of possible delamination of dielectric and conducting layers by minimising mechanical stresses caused by different rates of thermal expansion by keeping cell lateral dimensions relatively small (ie breaking large structures up into an array of cells). Hence it promotes a better reliability and thermal stability for the composite capacitor components.

Figure 9:
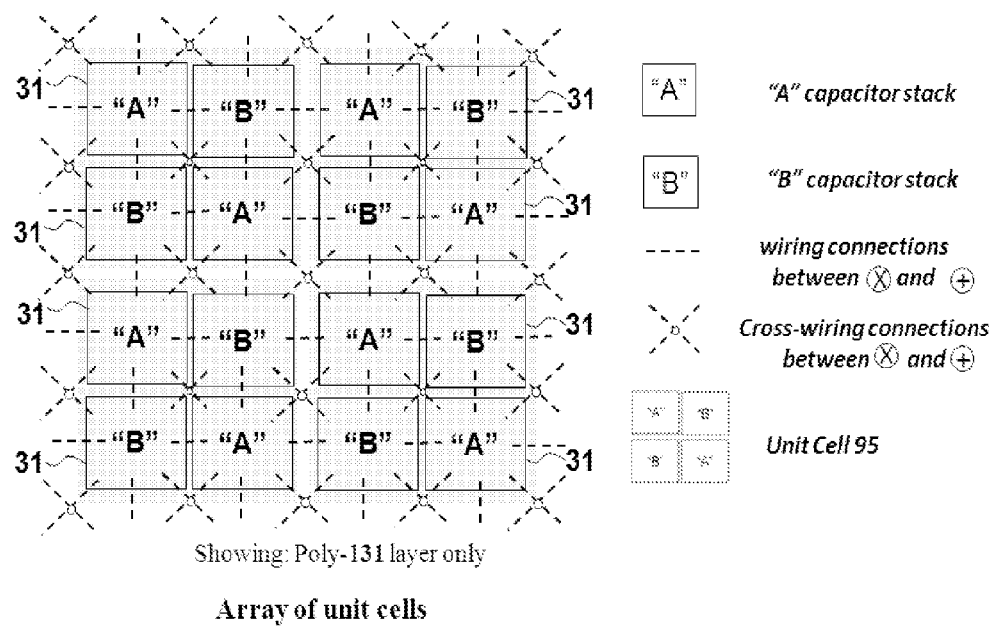
FIG. 9 shows an array of unit cells of common centroid "anti-parallel" capacitor stacks in accordance with an embodiment of the present invention.

FIG. 9 shows an example capacitor array for common centroid pairs of "anti-parallel" capacitor of unit cells. Inter-wiring between the cells is optimised to ensure that the capacitor value per unit area is maximised. This is desired for area efficiency of the design.

All the corners and edge-centre points of the unit cells constitute one plate of the composite capacitor. Edge connections positioned between these form the wiring for the opposite capacitor plate. It can be seen that the cross-wiring of one plate of all adjacent "A" type and "B" type capacitors is extended in diagonal directions and radiates from the corners of these capacitors. The opposite plate can be thought of as a square grid oriented at 45 degrees to the diagonal grid. This connecting grid also passes through the middle of "A" and "B" style capacitors, but joins adjacent components at the centre of their edges in each case, from "A" to "B" style capacitors.

The benefit of the present invention is that the common centroid pair of "anti-parallel" capacitor layout cells can be easily arrayed in a tessellated pattern (tiled array) so that the cells automatically connect together where they butt, to form the opposite capacitor plates.

Symmetry intrinsic in this design also ensures that an equal parasitic capacitance, eg to the underlying silicon substrate, is present for both sides of the capacitor.

What is claimed is:

1. A capacitor formed from at least four sub-capacitors connected in parallel with each other, each sub-capacitor having two conducting plates, and a dielectric region therebetween, wherein each sub-capacitor has a variation of capacitance with voltage which can be approximated by a polynomial having a linear coefficient and a quadratic coefficient, said four sub-capacitors comprising a first pair of sub-capacitors each having a first dielectric material with a negative quadratic coefficient and a second pair of sub-capacitors each having a second dielectric material with a positive quadratic coefficient, and wherein the two sub-capacitors of said first pair each have substantially the same linear coefficient and are arranged in anti-parallel so that their linear coefficients substantially cancel each other out.

2. A capacitor as claimed in claim 1, wherein the two quadratic coefficients of said two dielectric materials cancel each other to within 3 parts per million.

3. A capacitor as claimed in claim 1, wherein one of said dielectric materials is silicon dioxide.

4. A capacitor as claimed in claim 1, wherein one of said dielectric materials is silicon nitride.

5. A capacitor as claimed in claim 1, wherein said conducting plates are formed from at least one of metal or polysilicon.

6. A capacitor as claimed in claim 1, which comprises a first plurality of pairs of sub-capacitors, each pair having the properties of said first pair of sub-capacitors, and a second plurality of pairs of sub-capacitors, each pair having the properties of said second pair of sub-capacitors, said first plurality being arranged in a first array of sub-capacitors, and said second plurality being arranged in a second array of sub-capacitors.

7. A capacitor as claimed in claim 6, wherein the sub-capacitors of said first array are arranged in rows and columns, and connected so that the polarity of each sub-capacitor alternates along each row and down each column, so that each sub-capacitor of one polarity has four immediate neighbors of the opposite polarity, and also has four diagonal neighbors of the same polarity.

8. A capacitor as claimed in claim 1, wherein the two sub-capacitors of said second pair each have substantially the same linear coefficient and are arranged in anti-parallel so that their linear coefficients substantially cancel each other out.

9. A capacitor as claimed in claim 1, wherein said first pair of sub-capacitors are polysilicon-insulator-polysilicon capacitors.

10. A capacitor as claimed in claim 9, wherein silicon dioxide is used as an insulator between polysilicon plates of each polysilicon-insulator-polysilicon capacitor.

11. A capacitor as claimed in claim 1, wherein said second pair of sub-capacitors are metal-insulator-metal capacitors.

12. A capacitor as claimed in claim 11, wherein silicon nitride is used as an insulator between metal plates of each metal-insulator-metal capacitor.

13. A capacitor as claimed in claim 6, wherein the sub-capacitors of said second array are arranged in rows and columns, and connected so that the polarity of each sub-capacitor alternates along each row and down each column, so that each sub-capacitor of one polarity has four immediate neighbors of the opposite polarity, and also has four diagonal neighbors of the same polarity.

* * * * *